(12) United States Patent
Röhrer et al.

(10) Patent No.: US 11,355,653 B2
(45) Date of Patent: Jun. 7, 2022

(54) SPAD DEVICE FOR EXCESS BIAS MONITORING

(71) Applicant: ams AG, Premstaetten (AT)

(72) Inventors: Georg Röhrer, Lebring-Sanktmargarethen (AT); Robert Kappel, Wettmannstaetten (AT); Nenad Lilic, Graz (AT)

(73) Assignee: AMS AG, Premstaetten (AT)

( * ) Notice: Subject to any disclaimer, the term of this patent is extended or adjusted under 35 U.S.C. 154(b) by 289 days.

(21) Appl. No.: 16/633,121

(22) PCT Filed: Jul. 18, 2018

(86) PCT No.: PCT/EP2018/069553
§ 371 (c)(1),
(2) Date: Jan. 22, 2020

(87) PCT Pub. No.: WO2019/020472
PCT Pub. Date: Jan. 31, 2019

(65) Prior Publication Data
US 2020/0152807 A1    May 14, 2020

(30) Foreign Application Priority Data

Jul. 26, 2017   (EP) .................................... 17183326

(51) Int. Cl.
*H01L 31/02* (2006.01)
*H01L 31/0352* (2006.01)
*H01L 31/107* (2006.01)

(52) U.S. Cl.
CPC ............ *H01L 31/02027* (2013.01); *H01L 31/035272* (2013.01); *H01L 31/107* (2013.01)

(58) Field of Classification Search
None
See application file for complete search history.

(56) References Cited

U.S. PATENT DOCUMENTS

| 7,863,647 | B1 * | 1/2011 | Veliadis ............ H01L 27/14609 |
| | | | 257/186 |
| 10,834,345 | B1 * | 11/2020 | McGarvey ............. H04N 5/374 |
| 2002/0195545 | A1 | 12/2002 | Nishimura et al. |

(Continued)

FOREIGN PATENT DOCUMENTS

| EP | 3081963 | 10/2016 | |
| EP | 3081963 A1 * | 10/2016 | ............ G01J 1/4228 |

(Continued)

OTHER PUBLICATIONS

European Patent Office, International Search Report for PCT/EP2018/069553 dated Oct. 1, 2018.

*Primary Examiner* — Evren Seven
(74) *Attorney, Agent, or Firm* — MH2 Technology Law Group LLP

(57) ABSTRACT

The SPAD device comprises a single-photon avalanche diode and a further single-photon avalanche diode having breakdown voltages, the single-photon avalanche diodes being integrated in the same device. The breakdown voltages are equal or differ by less than 10%. The single-photon avalanche diode is configured to enable to induce triggering or to have a dark count rate that is higher than the dark count rate of the further single-photon avalanche diode.

14 Claims, 6 Drawing Sheets

(56) References Cited

U.S. PATENT DOCUMENTS

| | | | |
|---|---|---|---|
| 2008/0135736 A1* | 6/2008 | Koiwai | H01L 31/02027 |
| | | | 250/214 AG |
| 2009/0026494 A1* | 1/2009 | Itzler | H01L 31/107 |
| | | | 257/186 |
| 2010/0301194 A1* | 12/2010 | Patel | G01J 1/18 |
| | | | 250/208.2 |
| 2011/0248175 A1 | 10/2011 | Frach et al. | |
| 2013/0334411 A1 | 12/2013 | Brunel et al. | |
| 2014/0231630 A1 | 8/2014 | Rae et al. | |
| 2016/0182902 A1 | 6/2016 | Guo et al. | |

FOREIGN PATENT DOCUMENTS

| | | | | |
|---|---|---|---|---|
| EP | 3809472 A1 | * | 4/2021 | H01L 27/1446 |
| GB | 2510890 A | * | 8/2014 | H03K 17/941 |

* cited by examiner

SPAD DEVICE FOR EXCESS BIAS MONITORING

The present disclosure is related to single-photon avalanche diodes.

BACKGROUND OF THE INVENTION

Single-photon avalanche diodes (SPADs) are semiconductor devices with a p-n junction. A reverse bias is used to increase the width of the depletion region. When the operating voltage providing the reverse bias exceeds the breakdown voltage of the p-n junction by the so-called excess bias voltage, a single charge carrier injected into the depletion layer triggers a self-sustaining avalanche. The current rises swiftly unless the operating voltage is decreased to the breakdown voltage or below. The avalanche is initiated by pairs of electrons and holes, which are generated by photons from a light source or by a forward biased p-n junction.

The breakdown voltage changes with temperature and can be different for individual devices at the same temperature because of tolerances of the manufacturing process. It is important to control the excess bias voltage by a suitable circuit, because all key parameters of a single-photon avalanche diode, including photon detection probability PDP, dark count rate DCR, after pulsing probability, cross talk probability, timing jitter and capacitance, depend on the excess bias voltage. A low dark count rate is desired, but it causes tardy triggering and may therefore prevent the undelayed control of the excess bias voltage.

Faster triggering for calibration can be enabled by the use of a light source to illuminate the single-photon avalanche diode, but a light source may not be easily available for some types of applications.

SUMMARY OF THE INVENTION

The definitions as described above also apply to the following description unless stated otherwise.

The SPAD device comprises a single-photon avalanche diode and a further single-photon avalanche diode having breakdown voltages, the single-photon avalanche diodes being integrated in the same device, the breakdown voltages being equal or differing by less than 10%, especially by less than 2.5%. The single-photon avalanche diode is configured to enable to induce triggering or to have a dark count rate that is higher than the dark count rate of the further single-photon avalanche diode.

The single-photon avalanche diode is in particular provided for adjusting or controlling an excess bias voltage, while the further single-photon avalanche diode is provided for a detection of radiation. The single-photon avalanche diode and the further single-photon avalanche diode are configured for alternative operation.

In embodiments of the SPAD device, the single-photon avalanche diode has a dark count rate, the further single-photon avalanche diode has a further dark count rate, and the dark count rate is at least a factor 100 higher than the further dark count rate at least at one temperature below 25° C.

In further embodiments of the SPAD device, a p-n junction of the single-photon avalanche diode forms a base-collector junction of a structure of a bipolar transistor including an emitter region, a base region and a collector region. The bipolar transistor is configured for operation at a reverse collector-to-base voltage above the breakdown voltage.

In particular, the bipolar transistor is a vertical bipolar transistor. During operation of a vertical bipolar transistor, electric current across the base region flows in the direction normal to the main surface of the semiconductor substrate or wafer of the device. The current flow may additionally have a lateral component parallel to the main surface.

In further embodiments a quenching component is electrically connected with the base or the collector, and a switching circuitry is configured to apply a forward bias to the base-emitter junction.

A further embodiment comprises a substrate of semiconductor material, a shallow well of a first type of conductivity in a deep well of an opposite second type of conductivity in the substrate, the deep well and the shallow well forming a p-n junction of the single-photon avalanche photodiode. A junction-forming region of the second type of conductivity is arranged in the deep well under the shallow well. At the p-n junction the doping concentration of the junction-forming region is higher than a doping concentration of the deep well outside the junction-forming region. The further single-photon avalanche diode comprises a further shallow well of the first type of conductivity in the deep well or in a further deep well of the opposite second type of conductivity in the substrate, the further shallow well forming a further p-n junction with the deep well or further deep well. A further junction-forming region is arranged under the further shallow well, the further junction-forming region having a doping concentration for the second type of conductivity, at the further p-n junction said doping concentration being higher than a doping concentration of the deep well or further deep well outside the further junction-forming region. The single-photon avalanche diode and the further single-photon avalanche diode can be arranged in the same deep well. The areas of the p-n junction and the further p-n junction may be the same or differ at most by a factor of 2. An optional cover layer of dielectric material may be arranged on the shallow well above the junction-forming region.

In this embodiment a shallow well region is arranged in the shallow well, the shallow well region having a doping concentration that is higher than a doping concentration of the shallow well outside the shallow well region. The shallow well and the shallow well region occupy areas of the substrate surface of different sizes. A further shallow well region is arranged in the further shallow well, the further shallow well region having a doping concentration that is higher than a doping concentration of the further shallow well outside the further shallow well region.

A further embodiment comprises a peripheral region of the shallow well, the peripheral region reaching laterally beyond the junction-forming region. In particular, the peripheral region may not be covered by the shallow well region.

A further embodiment comprises an opening in the shallow well region, the opening being arranged above the junction-forming region. The opening may comprise separate portions.

A further embodiment comprises a polysilicon layer arranged above the shallow well and above the junction-forming region, in particular above an opening in the shallow well region. The cover layer is recessed under the polysilicon layer.

A further embodiment comprises a highly doped region of the second type of conductivity in the shallow well above the junction-forming region at a distance from the p-n junction. The highly doped region, the shallow well and the junction-forming region respectively form an emitter region, a base region and a collector region of the structure of a bipolar transistor.

A further embodiment comprises a deep well contact region in the deep well, the deep well contact region having a doping concentration that is higher than a doping concentration of the deep well.

A further embodiment comprises separate contact layers arranged on the deep well contact region and on the shallow well region.

In a further embodiment the contact layer arranged on the shallow well region covers at least 80% of the junction-forming region.

In a further embodiment the shallow well region does not cover the entire junction-forming region, and the further shallow well region is arranged above the entire further junction-forming region.

BRIEF DESCRIPTION OF THE DRAWINGS

The following is a detailed description of examples of the SPAD device in conjunction with the appended figures.

DETAILED DESCRIPTION

Figure 1:
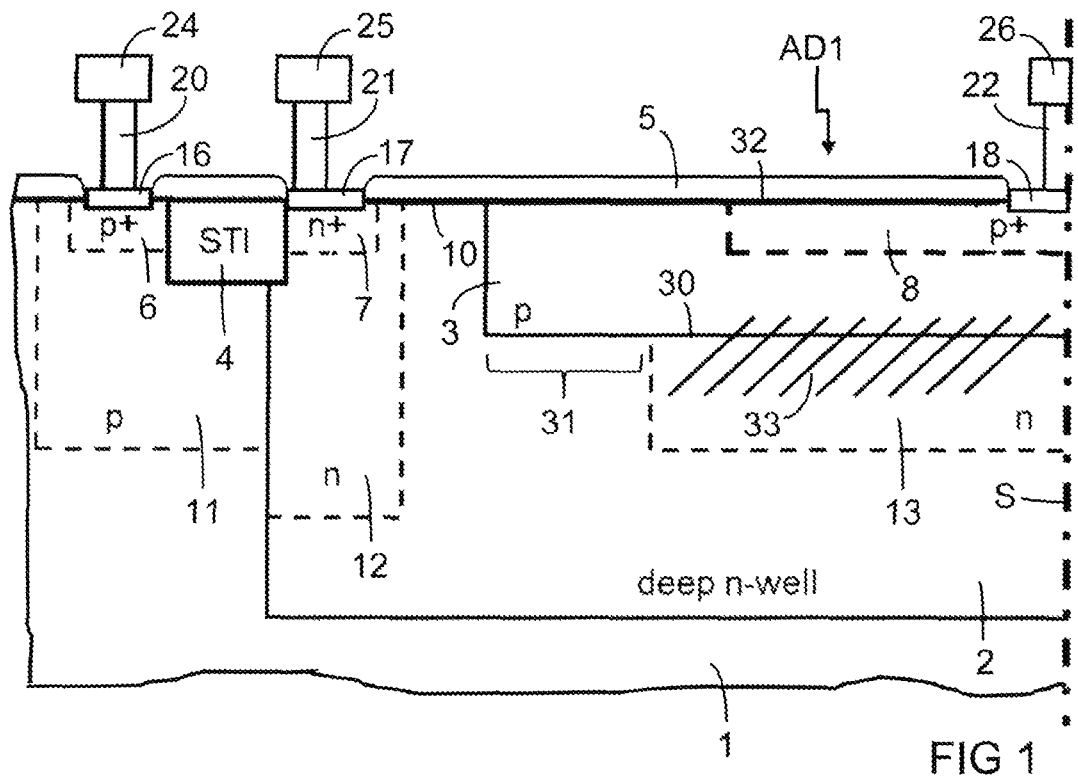
FIG. 1 is a partial cross section of a single-photon avalanche diode with high dark count rate.

FIG. 1 is a partial cross section of a single-photon avalanche diode AD1 with relatively high dark count rate. The single-photon avalanche diode AD1 need not be symmetrical, but it may comprise a symmetry. A rotational symmetry is indicated in the figures by the symmetry axis S as an example. The other appended figures show the same portion of the single-photon avalanche diode, so that the differences between the embodiments are evident.

The single-photon avalanche diode AD1 comprises a substrate 1 of semiconductor material, which may be silicon, for instance. Doped regions in the substrate 1 have a first type of conductivity or an opposite second type of conductivity. The first type of conductivity may be p-type conductivity, so that the second type of conductivity is n-type conductivity, as indicated in the figures by way of example. The types of conductivity may be reversed. Doping concentrations for either type of conductivity that are sufficiently high for the formation of ohmic contacts on the semiconductor material are respectively indicated by p+ and n+.

The substrate 1 may be intrinsically doped or have a low doping concentration for the first type of conductivity. At a main surface 10 of the substrate 1, a shallow well 3 of the first type of conductivity is located in a deep well 2 of the second type of conductivity. A p-n junction 30 is formed between the deep well 2 and the shallow well 3.

An isolation region 4, which may be a shallow trench isolation, for instance, can be present where a lateral boundary of the deep well 2 reaches the substrate surface 10. A cover layer 5 of a dielectric material, which locally prevents silicidation of the semiconductor material, may be present on the substrate surface 10. The cover layer 5 can be an oxide of the semiconductor material, in particular silicon nitride, silicon dioxide or a combination of silicon nitride and silicon oxide, for instance.

A substrate contact region 6, which has a high doping concentration for the first type of conductivity, may be provided if an electric connection of the substrate 1 is desired. The substrate contact region 6 is formed at the substrate surface 10 and may be arranged in a substrate region 11, which has a doping concentration for the first type of conductivity yielding an electric conductivity that is higher than the basic conductivity of the substrate 1.

A deep well contact region 7, which has a high doping concentration for the second type of conductivity, is provided for an electric connection of the deep well 2. The deep well contact region 7 is formed at the substrate surface 10 and may be arranged in a well region 12, which has a doping concentration for the second type of conductivity yielding an electric conductivity that is higher than the basic conductivity of the deep well 2.

A shallow well region 8, which has a high doping concentration for the first type of conductivity, is provided for an electric connection of the shallow well 3. The shallow well region 8 is arranged at the substrate surface 10 in the shallow well 3.

The high doping concentrations of the regions 6, 7, 8 enable to form ohmic contacts between the semiconductor material and electrically conductive contact layers. In the described examples, the contact layers are provided by optional silicide layers 16, 17, 18. If a cover layer 5 preventing silicidation is provided, the silicide layers 16, 17, 18 are formed in openings of the cover layer 5. Contact plugs 20, 21, 22 may be arranged in a dielectric layer, in particular an intermetal dielectric of a wiring, for instance. Such a dielectric layer is known per se in semiconductor technology, in particular standard CMOS technology, and not shown in the figures. The contact plugs 20, 21, 22 electrically connect the contact layers 16, 17, 18 to respective conductor layers 24, 25, 26, which may be conductor tracks in a structured metallization level of a wiring, for instance. If the silicide layers 16, 17, 18 are not provided, the contact plugs 20, 21, 22 can be applied directly on the regions 6, 7, 8.

In the example shown in FIG. 1, the contact plug 22 and the corresponding conductor layer 26, which are provided on the shallow well region 8, are rotationally symmetrically arranged on the symmetry axis S. The contact plug 22, the optional contact layer 18 and the corresponding conductor layer 26 can instead be arranged at any suitable position above the shallow well region 8. They may be symmetrical or not symmetrical.

A special region, which will be referred to as junction-forming region 13, is present in the deep well 2 under the shallow well 3 at the p-n junction 30 between the deep well 2 and the shallow well 3. The junction-forming region 13 has an elevated doping concentration for the second type of conductivity at least at the p-n junction 30 and thus provides an avalanche region where an avalanche multiplication of charge carriers takes place. A possible location of the avalanche region 33, which is essentially provided by the space-charge region at the p-n junction 30, is schematically indicated by a hatching. The avalanche region 33 may have a different extension and may even reach below the junction-forming region 13.

As shown in FIG. 1, the junction-forming region 13 may be confined to an area of the p-n junction 30 outside a lateral peripheral region 31 of the shallow well 3. The shallow well region 8 does not essentially extend laterally beyond the junction-forming region 13. In the example shown in FIG. 1, the shallow well region 8 is shorter than the junction-forming region 13. Therefore the peripheral region 31 is essentially free from the contact region 8.

Irregular occurrences of charge carriers at the interface 32 between the semiconductor material of the substrate 1 and the cover layer 5 may be the reason for an increased dark count rate. For normal operation of a single-photon avalanche diode, a low dark count rate is desired. This can be achieved by a higher doping concentration of the shallow well 3 at the interface 32 between the semiconductor material of the substrate 1 and the cover layer 5 at least above the junction-forming region 13.

Figure 11:
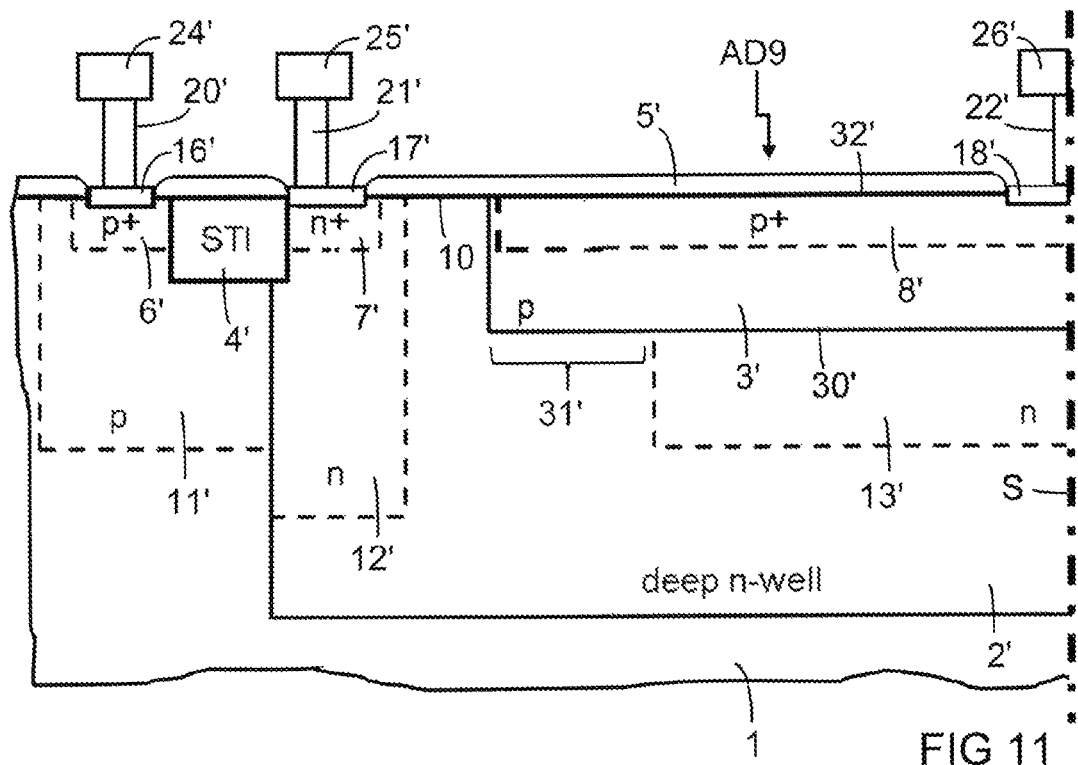
FIG. 11 is a partial cross section of a single-photon avalanche diode with low dark count rate.

FIG. 11 is a partial cross section of a single-photon avalanche diode AD9 with low dark count rate. Elements of the single-photon avalanche diode AD9 according to FIG. 11 corresponding to elements of the single-photon avalanche diode AD1 according to FIG. 1 are designated with the same reference numerals primed. In the single-photon avalanche diode AD9 according to FIG. 11, the shallow well region 8' extends above the junction-forming region 13' and substantially into the peripheral region 31' of the shallow well 3'. Hence the doping concentration of the shallow well 3' at the interface 32' between the semiconductor material of the substrate 1 and the cover layer 5' is higher than the doping concentration in the rest of the shallow well 3'. The shallow well region 8' is thus appropriate to remove charge carriers that might cause an increase of the dark count rate.

In the SPAD device according to embodiments of the invention, at least one single-photon avalanche diode having a low dark count rate, which may be the single-photon avalanche diode AD9 according to FIG. 11, is combined with at least one single-photon avalanche diode having a high dark count rate, which may be the single-photon avalanche diode AD1 according to FIG. 1. One single-photon avalanche diode of low dark count rate or a plurality of single-photon avalanche diodes of low dark count rate arranged in an array is employed for normal operation of the SPAD device in order to detect or measure according to the intended application. For the purpose of determining the breakdown voltage and adjusting the excess bias voltage, one single-photon avalanche diode of high dark count rate may be sufficient to achieve fast triggering.

The single-photon avalanche diodes according to FIGS. 1 and 11 differ in the dark count rate, but match in the other relevant parameters, in particular the varying levels of the breakthrough voltage at different temperatures. The breakdown voltage of the single-photon avalanche diode having a high dark count rate may be equal to the breakdown voltage of the single-photon avalanche diode having a low dark count rate. It will suffice if the breakdown voltage of the single-photon avalanche diode having a high dark count rate differs from the breakdown voltage of the single-photon avalanche diode having a low dark count rate by less than 10%, especially by less than 2.5%, at 25° C., for instance. The high dark count rate may be at least a factor of 100 higher than the low dark count rate. Practically, the high dark count rate may be several orders of magnitude higher than the low dark count rate.

Figure 2:
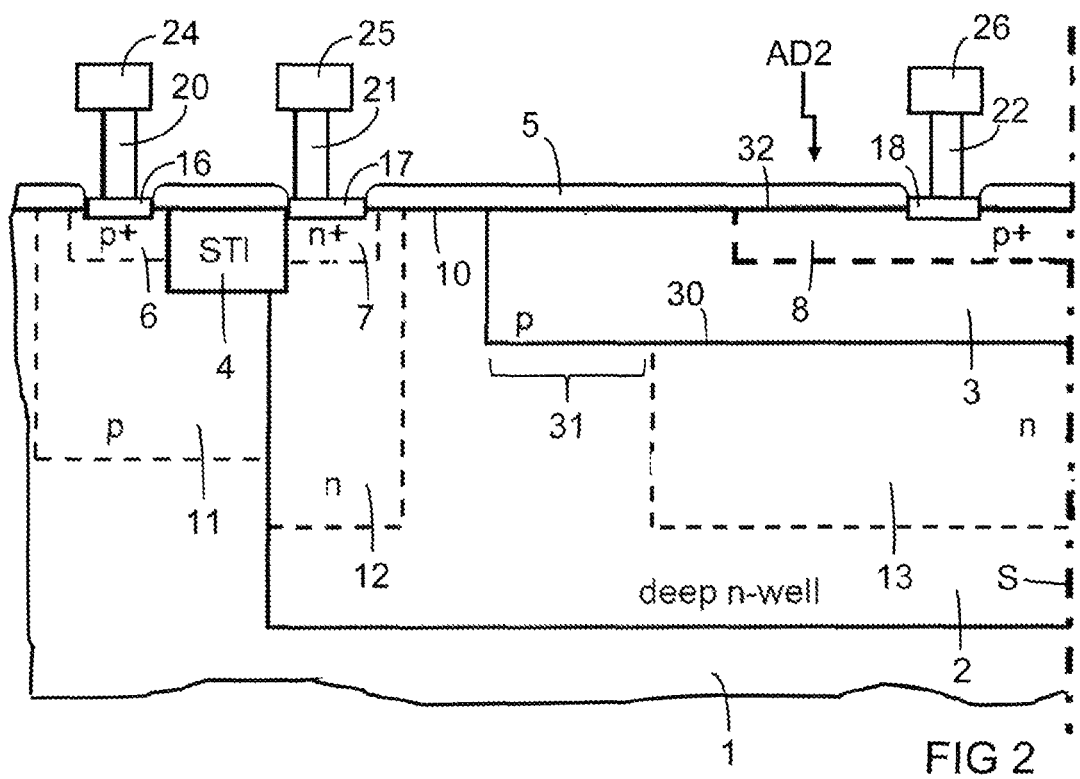
FIG. 2 is a partial cross section of a further single-photon avalanche diode with high dark count rate.

FIG. 2 is a partial cross section of a further single-photon avalanche diode AD2 with high dark count rate. Elements of the single-photon avalanche diode AD2 according to FIG. 2 corresponding to elements of the single-photon avalanche diode AD1 according to FIG. 1 are designated with the same reference numerals. In the single-photon avalanche diode AD2 according to FIG. 2, the well region 12 and the junction-forming region 13 have the same depth. In this embodiment, the well region 12 and the junction-forming region 13 can be formed by the same implantation of dopant for the second type of conductivity. FIG. 2 also shows a different arrangement of the contact layer 18, the contact plug 22 and the corresponding conductor layer 26, which are provided for the electric connection of the shallow well region 8 and, in the embodiment according to FIG. 2, are not arranged on an optional symmetry axis S.

Figure 3:
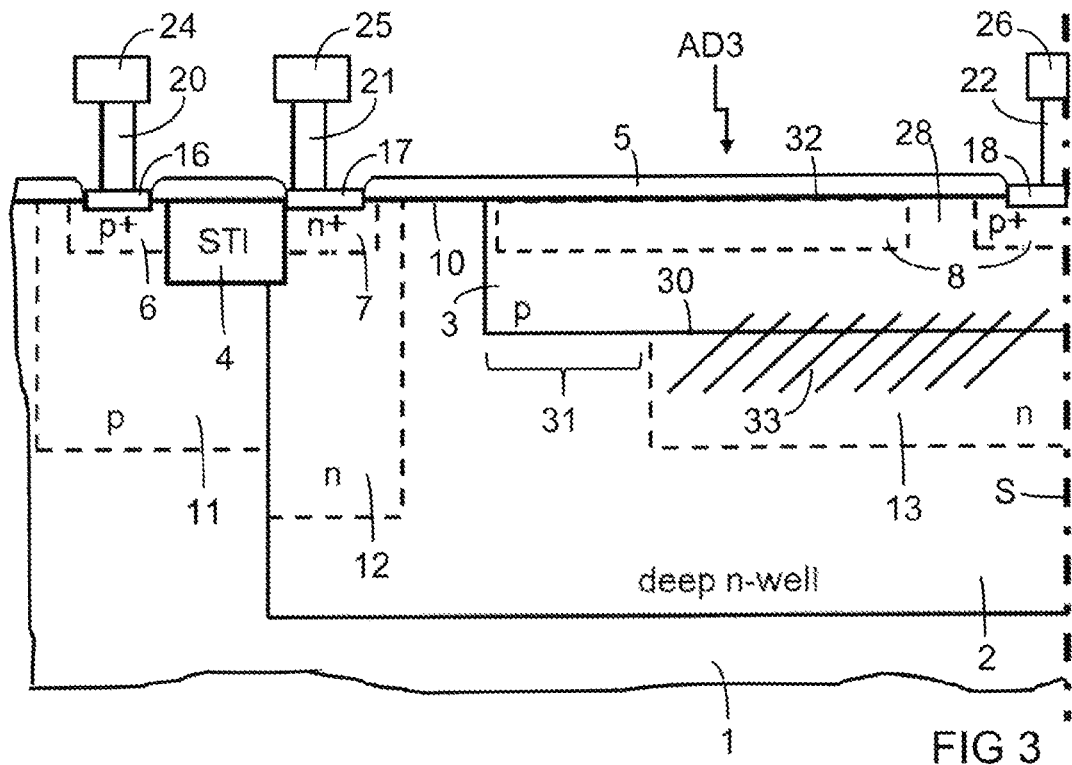
FIG. 3 is a partial cross section of a single-photon avalanche diode according to FIG. 1 with an opening in a shallow well region.

FIG. 3 is a partial cross section of a further single-photon avalanche diode AD3 with high dark count rate. Elements of the single-photon avalanche diode AD3 according to FIG. 3 corresponding to elements of the single-photon avalanche diode AD1 according to FIG. 1 are designated with the same reference numerals. In the single-photon avalanche diode AD3 according to FIG. 3, the shallow well region 8 extends into the peripheral region 31, as shown in FIG. 3, but it is provided with an opening 28 above the junction-forming region 13. The opening 28 may comprise any geometrical shape. It may be symmetrical or symmetrically arranged with respect to an optional symmetry axis S, but a symmetry is not necessary.

The arrangement of the highly doped shallow well region 8 in the shallow well 3 according to FIG. 3 has the advantage that the device structure in the peripheral region 31 is similar to the single-photon avalanche diode AD9 of low dark count rate according to FIG. 11. Thus an excellent match is obtained between the single-photon avalanche diodes of low and high dark count rates, especially with respect to the breakdown voltage at the lateral p-n junction. As the p+ surface layer is missing in the opening 28 above the junction-forming region 13, a high dark count rate is obtained in a manner similar to the single-photon avalanche diode AD1 according to FIG. 1.

In the single-photon avalanche diode AD3 according to FIG. 3, the junction-forming region 13 may be deeper than shown, in particular as deep as in the single-photon avalanche diode AD2 according to FIG. 2. The arrangements of all contacts may differ from the arrangements shown in FIG. 3, and in particular the contact layer 18, the contact plug 22 and the corresponding conductor layer 26, which are provided for the electric connection of the shallow well region 8, may be symmetrical with respect to an optional symmetry axis S, but a symmetry is not necessary.

Figure 4:
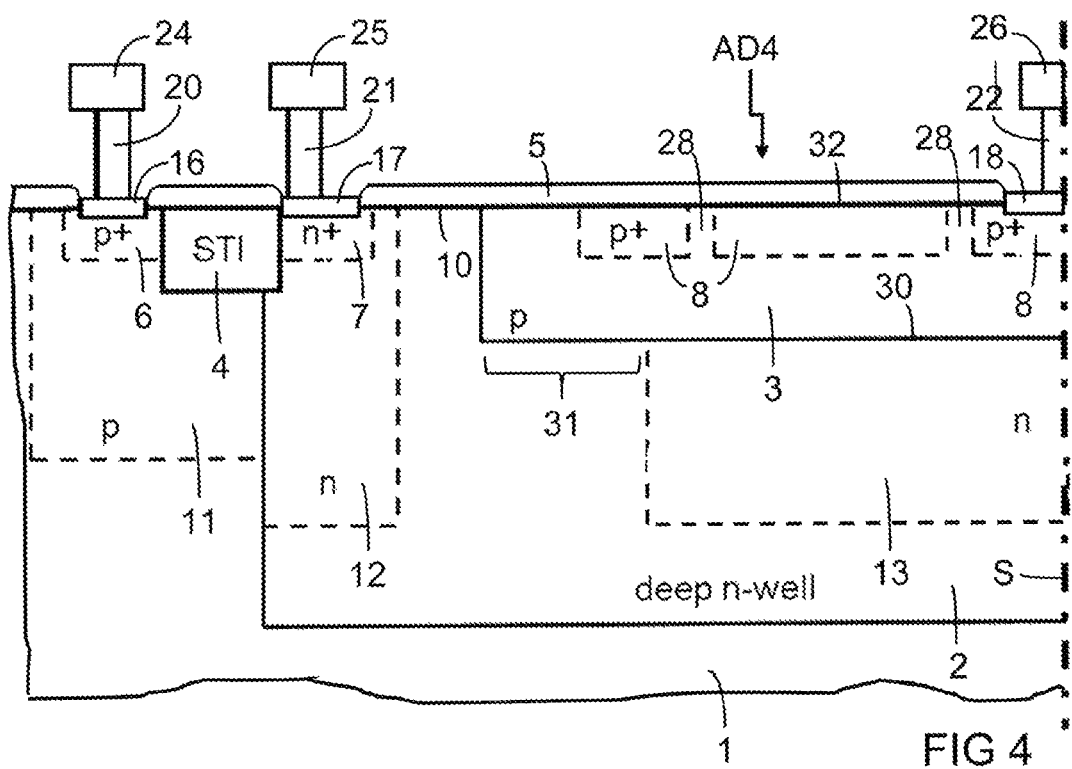
FIG. 4 is a partial cross section of a single-photon avalanche diode according to FIG. 2 with openings in a reduced shallow well region.

FIG. 4 is a partial cross section of a further single-photon avalanche diode AD4 with high dark count rate. Elements of the single-photon avalanche diode AD4 according to FIG. 4 corresponding to elements of the single-photon avalanche diode AD3 according to FIG. 3 are designated with the same reference numerals. In the single-photon avalanche diode AD4 according to FIG. 4, the shallow well region 8 does not laterally extend all over the peripheral region 31, but its extension is reduced, compared to the shallow well region 8' of the single-photon avalanche diode AD9 according to FIG. 11.

The shallow well region 8 of the single-photon avalanche diode AD4 according to FIG. 4 comprises an opening 28 above the junction-forming region 13. The opening 28 may comprise two or more separate openings, or the areas of the opening 28 that are shown in FIG. 4 may be cross sections of connected portions of the opening 28.

Figure 5:
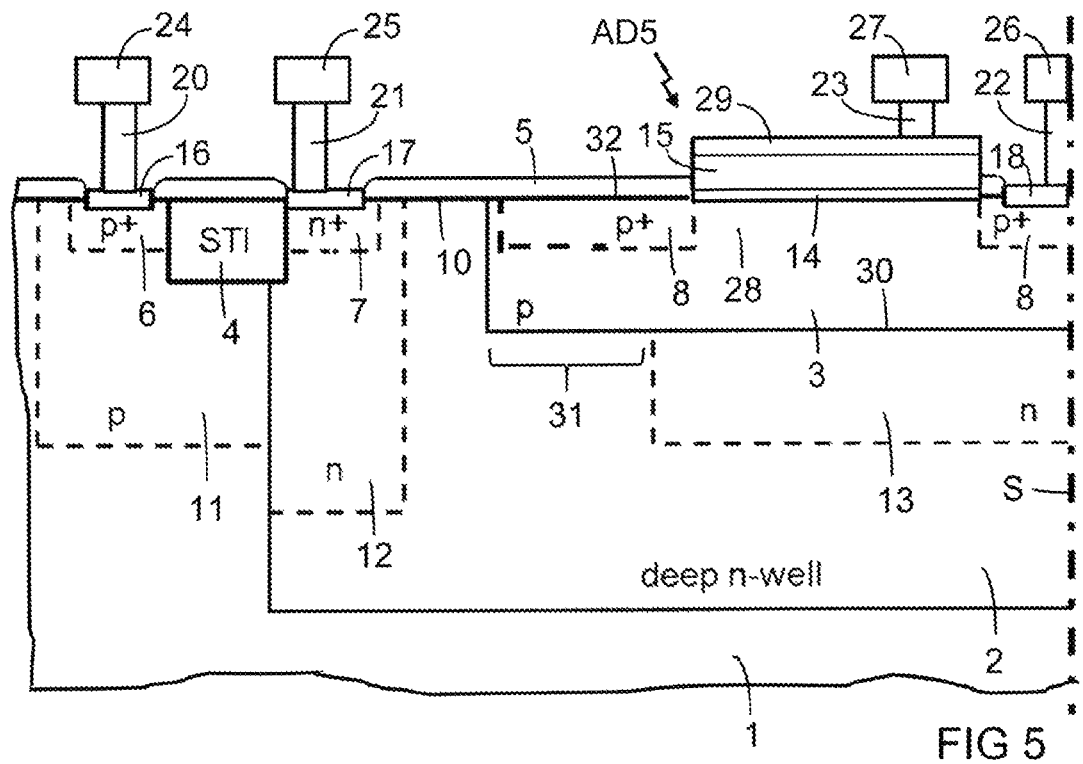
FIG. 5 is a partial cross section of a single-photon avalanche diode according to FIG. 3 with a polysilicon layer.

FIG. 5 is a partial cross section of a further single-photon avalanche diode AD5 with high dark count rate. Elements of the single-photon avalanche diode AD5 according to FIG. 5 corresponding to elements of the single-photon avalanche diode AD3 according to FIG. 3 are designated with the same reference numerals. In the single-photon avalanche diode AD5 according to FIG. 5, the cover layer 5 is interrupted above the junction-forming region 13 by a layer sequence that is similar to a gate electrode. The layer sequence comprises a gate oxide 14 on the substrate surface 10 and a polysilicon layer 15 on the gate oxide 14.

A further silicide layer 29 may be arranged on the polysilicon layer 15 for an electric connection to a further conductor layer 27 by a further contact plug 23. The conductor layer 26 that is connected to the shallow well region 8 and the further conductor layer 27 may especially be connected to one another or formed by a continuous conductor track, so that the shallow well region 8 and the polysilicon layer 15 are permanently on the same electric potential.

The layer sequence including the polysilicon layer 15 locally prevents the formation of a p+ doping within the shallow well 3, so that an opening 28 of the shallow well region 8 is formed under the polysilicon layer 15. The polysilicon layer 15 can be either n-type or p-type polysilicon. The polysilicon layer 15 can be doped together with the implantation of the shallow well region 8. In this case the polysilicon layer 15 comprises the first type of conductivity, which is p-type conductivity in the example shown in FIG. 5.

Figure 6:
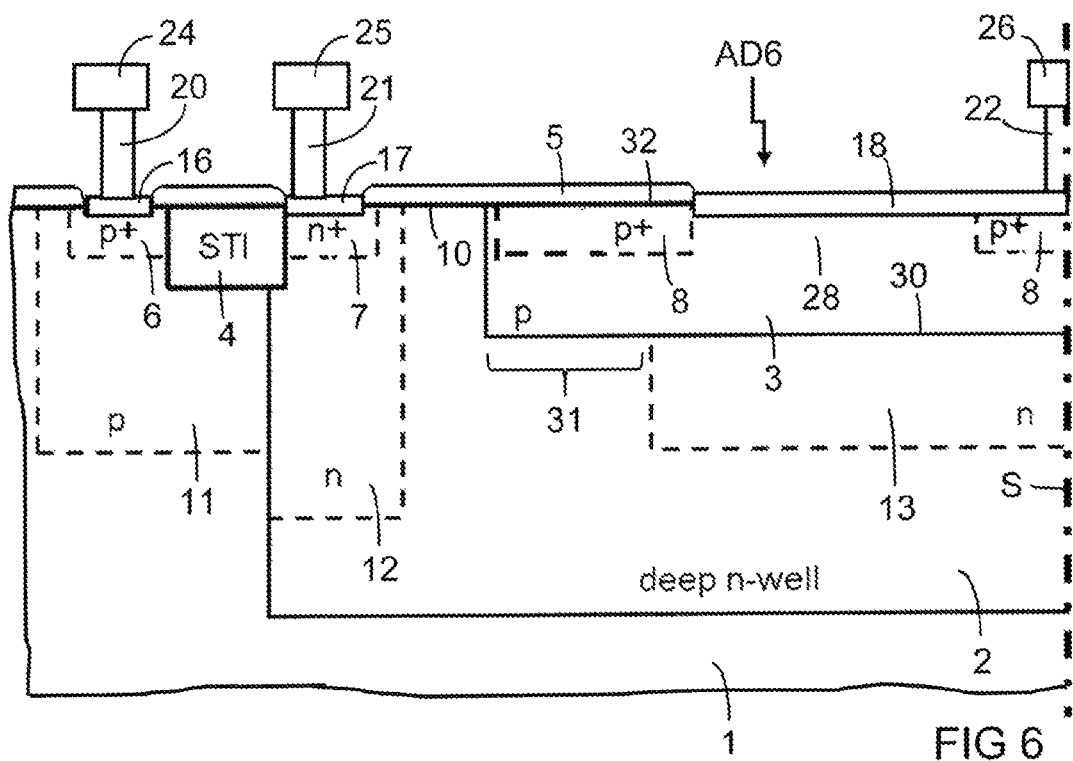
FIG. 6 is a partial cross section of a single-photon avalanche diode according to FIG. 3 with an extended silicide layer on the shallow well region.

FIG. 6 is a partial cross section of a further single-photon avalanche diode AD6 with high dark count rate. Elements of the single-photon avalanche diode AD6 according to FIG. 6 corresponding to elements of the single-photon avalanche diode AD3 according to FIG. 3 are designated with the same reference numerals. In the single-photon avalanche diode AD6 according to FIG. 6, the contact layer 18 on the shallow well region 8 has a larger extension compared to the corresponding contact layer 18 of the single-photon avalanche diode AD3 according to FIG. 3. The contact layer 18 covers a portion of the junction-forming region 13 and an opening 28 of the shallow well region 8.

In the single-photon avalanche diode AD6 according to FIG. 6, the contact layer 18 may extend to the peripheral region 31. The contact layer 18 may instead cover a smaller area and may especially not reach to the peripheral region 31, as shown in FIG. 6 by way of example. The contact layer 18 may be silicide, which renders a poor quality of the interface 32 between the semiconductor material and the contact layer 18 and thus yields a particularly high dark count rate.

When the single-photon avalanche diode AD9 according to FIG. 11 is operated in the dark at a temperature below approximately 50° C., it triggers at a very low count rate, which can typically be less than 10 cps (counts per second) at 10° C. The dark count rate of the single-photon avalanche diodes AD1, AD2, AD3, AD4, AD5, AD6 according to FIGS. 1 to 6 is substantially higher at temperatures below 50° C. by orders of magnitude.

The single-photon avalanche diodes with high dark count rate AD1, AD2, AD3, AD4, AD5, AD6 according to FIGS. 1 to 6 match the single-photon avalanche diode AD9 according to FIG. 11 with respect to the breakdown voltage. Hence one of the described single-photon avalanche diodes AD1, AD2, AD3, AD4, AD5, AD6 with high dark count rate can ideally be combined with one or more single-photon avalanche diodes AD9 with low count rate on the same semiconductor chip to render a SPAD device that allows excess bias monitoring without use of a light source to accelerate triggering.

At least one single-photon avalanche diode with high dark count rate, according to FIGS. 1 to 6, and one or more single-photon avalanche diodes with low dark count rate, as the one shown in FIG. 11, can be arranged in the same SPAD device and in particular in the same deep well 2.

Figure 7:
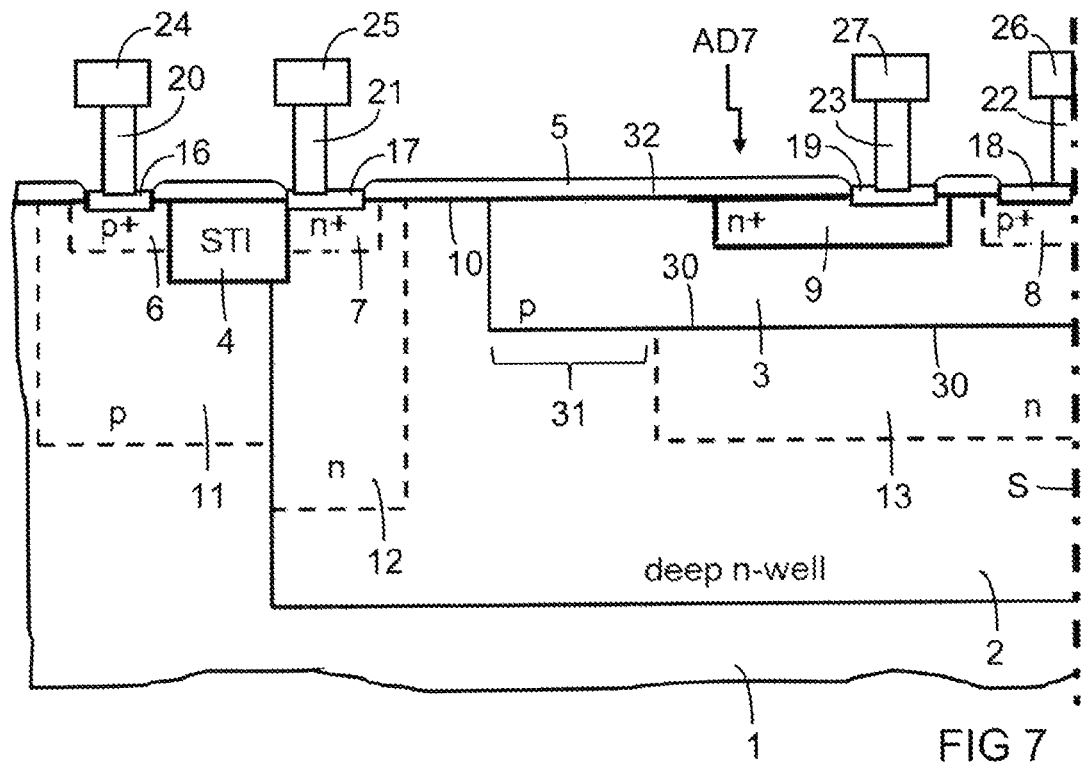
FIG. 7 is a partial cross section of a single-photon avalanche diode with an oppositely doped region in the shallow well.

FIG. 7 is a partial cross section of a further single-photon avalanche diode AD7. Elements of the single-photon avalanche diode AD7 according to FIG. 7 corresponding to elements of the single-photon avalanche diode AD1 according to FIG. 1 are designated with the same reference numerals. In the single-photon avalanche diode AD7 according to FIG. 7, a highly doped region 9 of the second type of conductivity is arranged at the substrate surface 10 in the shallow well 3 at a small distance from the shallow well region 8, which may be confined to a relatively small region.

An electric contact on the highly doped region 9 of the second type of conductivity can be formed by a further contact layer 19, which may be a silicide layer, for instance. A further contact plug 23 can be applied to connect the contact layer 19 with a further conductor layer 27. Instead, the further contact plug 23 can directly be applied on the highly doped region 9. The highly doped region 9 enables a precise control of the number of charge carriers injected into the p-n junction 30 by means of the current through the further p-n junction between the highly doped region 9 and the shallow well 3.

The arrangement of the highly doped region 9, the shallow well 3 and the junction-forming region 13 forms the structure of a bipolar transistor. The highly doped region 9 corresponds to the emitter, the shallow well 3 to the base, and the junction-forming region 13 to the collector. When an operating voltage for reverse bias above the breakdown voltage is applied to the p-n junction 30, which is the base-collector junction, the triggering of the single-photon avalanche photodiode can be controlled by the emitter current or the base-emitter voltage.

In particular, the bipolar transistor is a vertical bipolar transistor. The deep well 2, which provides the collector, has a region that reaches deeper into the substrate 1 than the shallow well 3, which provides the base. The junction-forming region 13 especially is a region of the deep well 2 that is arranged below the shallow well 3. Thus the distance of the junction-forming region 13 from the substrate surface 10 is larger than the distance of the shallow well 3 from the substrate surface 10. Hence the movement of charge carriers of an electric current through the shallow well 3 and the p-n junction 30 has a component in the direction normal to the substrate surface 10.

In the SPAD device according to further embodiments of the invention, at least one single-photon avalanche diode having a low dark count rate, which may be the single-photon avalanche diode AD9 according to FIG. 11, is combined with at least one single-photon avalanche diode comprising a structure of a bipolar transistor configured for triggering, which may be the single-photon avalanche diode AD7 according to FIG. 7. One single-photon avalanche diode of low dark count rate or a plurality of single-photon avalanche diodes of low dark count rate arranged in an array is employed for normal operation of the SPAD device in order to detect or measure according to the intended application. For the purpose of adjusting the excess bias voltage, one single-photon avalanche diode comprising a structure of a bipolar transistor may be sufficient for the purpose of fast triggering.

Figure 8:
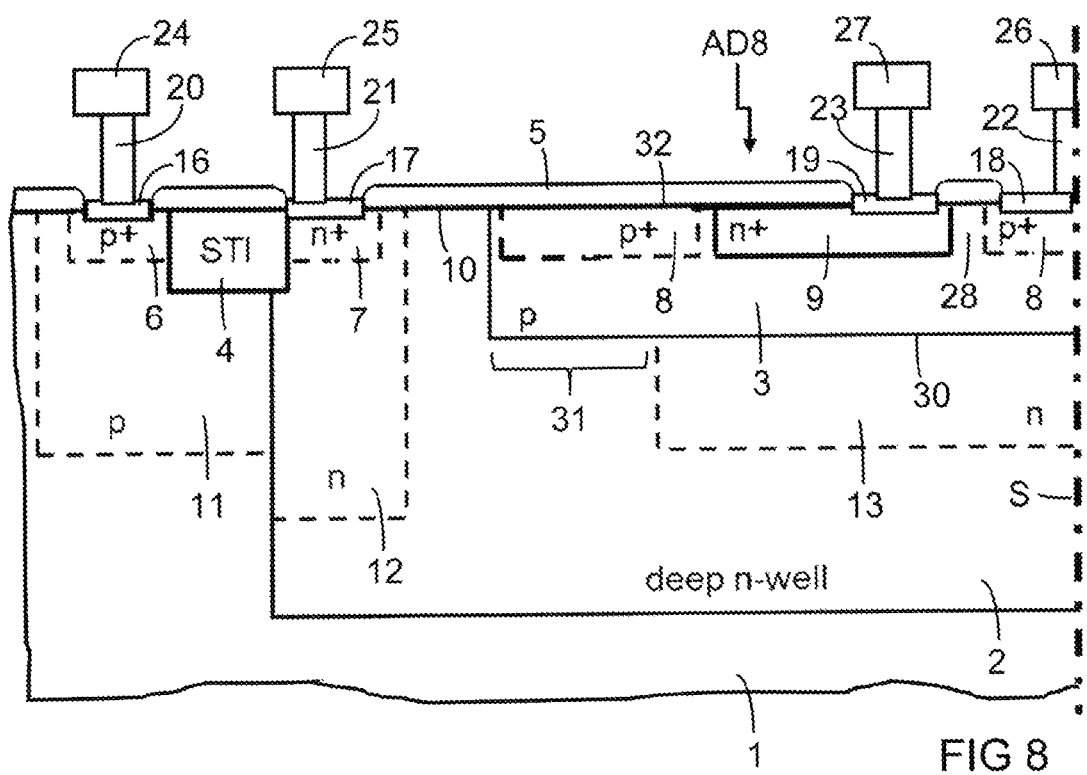
FIG. 8 is a partial cross section according to FIG. 7 with an oppositely doped region in an opening of the shallow well region.

FIG. 8 is a partial cross section of a further single-photon avalanche diode AD8 comprising a structure of a bipolar transistor. Elements of the single-photon avalanche diode AD8 according to FIG. 8 corresponding to elements of the single-photon avalanche diode AD7 according to FIG. 7 are designated with the same reference numerals. In the single-photon avalanche diode AD8 according to FIG. 8, the shallow well region 8 extends into the peripheral region 31. The highly doped region 9 of the second type of conductivity is arranged at the substrate surface 10 in the shallow well 3 in an opening 28 of the shallow well region 8. In particular, the bipolar transistor is a vertical bipolar transistor, as described above in conjunction with FIG. 7.

Figure 9:
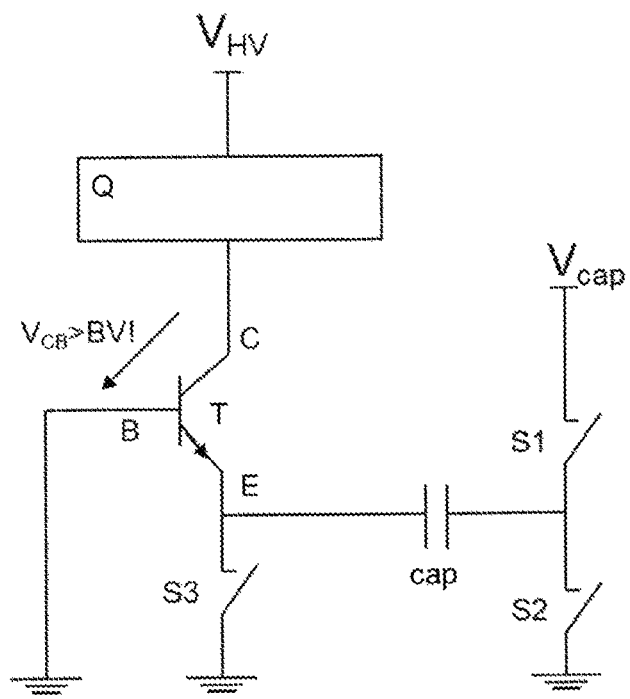
FIG. 9 is a circuit diagram for the single-photon avalanche diode according to FIG. 7 or 8.

FIG. 9 is a circuit diagram showing the application of a single-photon avalanche diode according to FIG. 7 or 8 for the triggering. The components of the circuit can be integrated in the same semiconductor chip. The circuit comprises a bipolar transistor T that is configured to be operated at a reverse collector-to-base voltage $V_{CB}$ exceeding the breakdown voltage BV of the base-collector junction. The bipolar transistor of a single-photon avalanche diode according to FIG. 7 or 8 is suitable for an application in the circuit according to FIG. 9.

A quenching component Q is provided and can be connected between the collector C and a high voltage $V_{HV}$, as shown in FIG. 9. The quenching component Q may comprise a resistor or a transistor, for instance, or an active quenching circuit, which is known per se.

In the circuit according to FIG. 9, the emitter E of the bipolar transistor T is connected to a capacitor (cap). A first switch S1, a second switch S2 and a third switch S3 allow to connect the capacitor between the ground potential and a dedicated capacitor voltage $V_{cap}$ or between the ground potential and the emitter E. A typical switching sequence during operation of the device is: 1.) S1 and S3 are closed to charge the capacitor to $V_{cap}$; 2.) S1 and S3 are opened; 3.) S2 is closed, so that the capacitor is discharged through the emitter E to trigger the avalanche breakdown.

Figure 10:
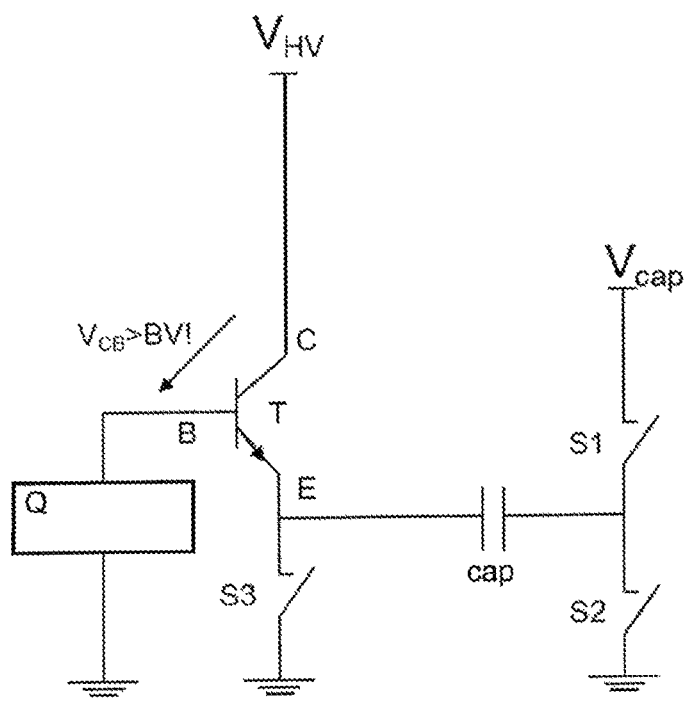
FIG. 10 is an alternative circuit diagram for the single-photon avalanche diode according to FIG. 7 or 8.

FIG. 10 is a further circuit diagram showing the application of a single-photon avalanche diode according to FIG. 7 or 8 for the triggering. The components of the circuit can be integrated in the same semiconductor chip. The circuit shown in FIG. 10 differs from the circuit shown in FIG. 9 in that the quenching component Q is connected to the base B.

Figure 12:
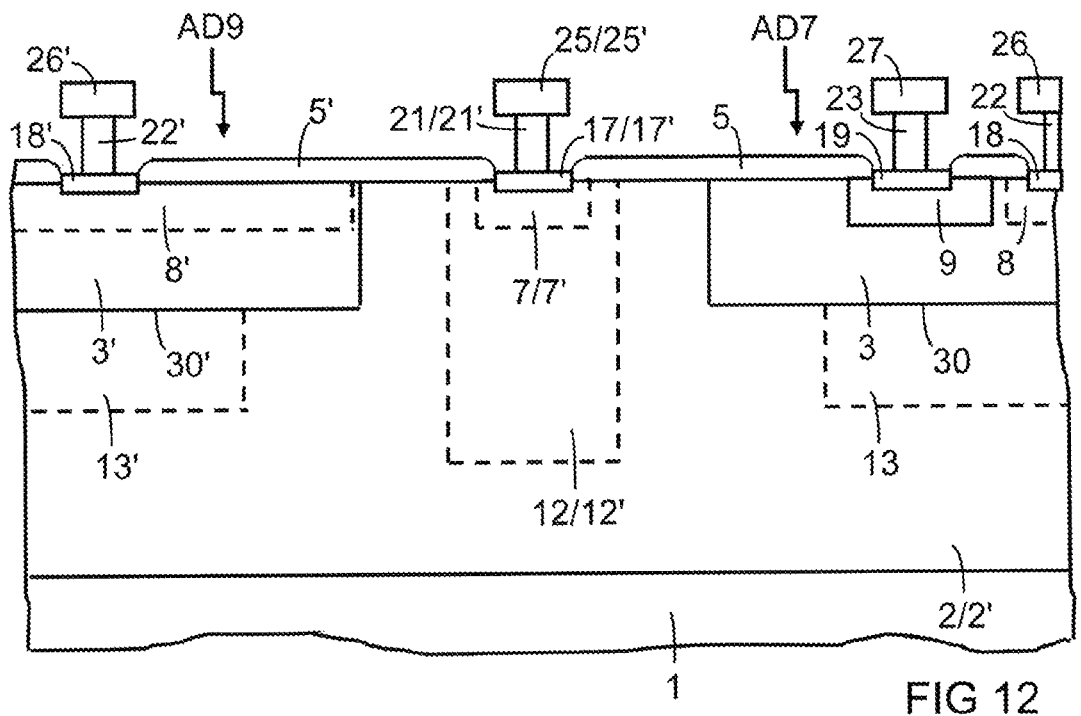
FIG. 12 is a partial cross section of a device including single-photon avalanche diodes with low and high dark count rates arranged in the same deep well.

FIG. 12 is a partial cross section of a device including a single-photon avalanche diode with low dark count rate and a single-photon avalanche diode according to one of the FIGS. 1 to 8, which are arranged in the same deep well. On the left side of FIG. 12, the device structure is similar to the single-photon avalanche diode according to FIG. 11, and on the right side of FIG. 12, the device structure is similar to the embodiment according to FIG. 7, by way of example. Each of these single-photon avalanche diodes AD9, AD7 comprises a shallow well 3, 3', a junction-forming region 13, 13' and a shallow well region 8, 8'.

In the example shown in FIG. 12, the single-photon avalanche diode AD7 comprises a highly doped region 9 of the second type of conductivity, which yields the structure of a bipolar transistor. It can be used to control the triggering of the SPAD device by the applied emitter current or base-emitter voltage.

The well region 12/12' and the deep well contact region 7/7' may be arranged between the single-photon avalanche diodes AD9, AD7. A substrate contact may be laterally disposed and is not shown in the cross section of FIG. 12. Contacts and optional contact layers can be provided for the doped regions and wells according to the embodiments previously described. Any number of single-photon avalanche diodes with high or low dark count rate or comprising the structure of a bipolar transistor may thus be arranged in the same deep well of the same semiconductor chip. This has the advantage that the integrated single-photon avalanche diodes are relatively close to one another and are therefore exposed to the same ambient conditions, in particular temperature. Furthermore, a close arrangement of the single-photon avalanche diodes enhances the matching of the breakdown voltages.

The invention claimed is:

1. A SPAD device, comprising:
    a single-photon avalanche diode having a breakdown voltage and a dark count rate,
    a further single-photon avalanche diode having a further breakdown voltage and a further dark count rate, the further single-photon avalanche diode being integrated with the single-photon avalanche diode, and
    the dark count rate being at least a factor 100 higher than the further dark count rate at least at one temperature below 25° C.

2. The SPAD device according to claim 1, further comprising:
    a p-n junction of the single-photon avalanche diode forming a base-collector junction of a structure of a bipolar transistor including an emitter region, a base region and a collector region, the bipolar transistor being configured for operation at a reverse collector-to-base voltage above a breakdown voltage.

3. The SPAD device according to claim 2, further comprising:
    a quenching component electrically connected with the base or the collector, and
    a switching circuitry configured to apply a forward bias to the base-emitter junction.

4. The SPAD device according to claim 1, wherein
    the single-photon avalanche diode is provided for adjusting or controlling an excess bias voltage,
    the further single-photon avalanche diode is provided for a detection of radiation, and
    the single-photon avalanche diode and the further single-photon avalanche diode are configured for alternative operation.

5. The SPAD device according to claim 1, further comprising:
    a substrate of semiconductor material,
    the single-photon avalanche diode comprising
        a shallow well of a first type of conductivity in a deep well of an opposite second type of conductivity in the substrate, the deep well and the shallow well forming a p-n junction,
        a junction-forming region arranged in the deep well under the shallow well, the junction-forming region having a doping concentration for the second type of conductivity, at the p-n junction said doping concentration being higher than a doping concentration of the deep well outside the junction-forming region, and a shallow well region in the shallow well, the shallow well region having a doping concentration that is higher than a doping concentration of the shallow well outside the shallow well region, the further single-photon avalanche diode comprising a further shallow well of the first type of conductivity in the deep well or in a further deep well of the opposite second type of conductivity in the substrate, the further shallow well forming a further p-n junction with the deep well or further deep well, a further junction-forming region arranged under the further shallow well, the further junction-forming region having a doping concentration for the second type of conductivity, at the further p-n junction said doping concentration being higher than a doping concentration of the deep well or further deep well outside the further junction-forming region, and a further shallow well region in the further shallow well, the further shallow well region having a doping concentration that is higher than a doping concentration of the further shallow well outside the further shallow well region.

6. The SPAD device according to claim 5, further comprising:

a peripheral region of the shallow well, the peripheral region reaching laterally beyond the junction-forming region.

7. The SPAD device according to claim 6, wherein the peripheral region of the shallow well is not covered by the shallow well region.

8. The SPAD device according to claim 5, further comprising:

an opening in the shallow well region, the opening being arranged above the junction-forming region.

9. The SPAD device according to claim 8, further comprising:

a polysilicon layer arranged above the opening.

10. The SPAD device according to claim 5, further comprising:

a highly doped region of the second type of conductivity in the shallow well above the junction-forming region at a distance from the p-n junction, the highly doped region, the shallow well and the junction-forming region respectively forming an emitter region, a base region and a collector region of a structure of a bipolar transistor.

11. The SPAD device according to claim 5, further comprising:

a deep well contact region in the deep well, the deep well contact region having a doping concentration that is higher than a doping concentration of the deep well.

12. The SPAD device according to claim 5, wherein the shallow well region does not cover the entire junction-forming region, and the further shallow well region is arranged above the entire further junction-forming region.

13. A SPAD device, comprising:

a single-photon avalanche diode having a breakdown voltage, a further single-photon avalanche diode having a further breakdown voltage, the further single-photon avalanche diode being integrated with the single-photon avalanche diode, the single-photon avalanche diode having a dark count rate, the further single-photon avalanche diode having a further dark count rate, and the dark count rate being at least a factor 100 higher than the further dark count rate at least at one temperature below 25° C., wherein the single-photon avalanche diode is provided for adjusting or controlling an excess bias voltage, the further single-photon avalanche diode is provided for a detection of radiation, and the single-photon avalanche diode and the further single-photon avalanche diode are configured for alternative operation.

14. A SPAD device, comprising:

a single-photon avalanche diode having a breakdown voltage, and a further single-photon avalanche diode having a further breakdown voltage, the further single photon avalanche diode being integrated with the single-photon avalanche diode, wherein:

the single-photon avalanche diode having a dark count rate that is higher than a dark count rate of the further single-photon avalanche diode, and a p-n junction of the single-photon avalanche diode forms a base-collector junction of a structure of a bipolar transistor including an emitter region, a base region and a collector region.

* * * * *